(12) United States Patent
Kim et al.

(10) Patent No.: US 10,562,781 B2
(45) Date of Patent: Feb. 18, 2020

(54) ANGLE-INDEPENDENT COLLOIDAL PARTICLES-BASED STRUCTURE AND METHOD FOR PRODUCING THE SAME

(71) Applicant: RESEARCH & BUSINESS FOUNDATION SUNGKYUNKWAN UNIVERSITY, Suwon-si, Gyeonggi-do (KR)

(72) Inventors: Seung Hyun Kim, Cheongju-si (KR); Gi Ra Yi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 15/883,213

(22) Filed: Jan. 30, 2018

(65) Prior Publication Data

US 2018/0222753 A1 Aug. 9, 2018

(30) Foreign Application Priority Data

Feb. 6, 2017 (KR) .......................... 10-2017-0015955

(51) Int. Cl.

| | |
|---|---|
| *C01B 33/14* | (2006.01) |
| *C09C 1/00* | (2006.01) |
| *C30B 29/60* | (2006.01) |
| *C09D 5/33* | (2006.01) |
| *C09B 67/08* | (2006.01) |
| *G02B 1/00* | (2006.01) |

(Continued)

(52) U.S. Cl.
CPC .......... *C01B 33/14* (2013.01); *B01J 13/0008* (2013.01); *B01J 13/18* (2013.01); *B01J 13/203* (2013.01); *C09B 67/0005* (2013.01); *C09B 67/0007* (2013.01); *C09C 1/0015* (2013.01); *C09C 1/30* (2013.01); *C09D 5/004* (2013.01); *C30B 29/602* (2013.01); *G02B 1/005* (2013.01); *B82Y 20/00* (2013.01)

(58) Field of Classification Search
CPC ...... B01J 13/0008; B01J 13/18; B01J 13/203; B82Y 20/00; C01B 33/14; C09B 67/0005; C09B 67/0007; C09C 1/0015; C09C 1/30; C09D 5/004; C30B 29/602; G02B 1/005

See application file for complete search history.

(56) References Cited

U.S. PATENT DOCUMENTS

2016/0015652 A1 * 1/2016 John ...................... B01J 13/22
424/490

FOREIGN PATENT DOCUMENTS

KR 20100065597 A 6/2010

OTHER PUBLICATIONS

Fuji et al. (KONA Powder and Particle Journal 2013;30:47-48) (Year: 2013).*

(Continued)

*Primary Examiner* — Ernst V Arnold
(74) *Attorney, Agent, or Firm* — NSIP Law

(57) ABSTRACT

One embodiment of the present disclosure provides a method for producing an angle-independent colloidal particles-based structure, the method having: preparing two or more types of hollow colloidal particles, wherein the types are distinguished based on a size of the hollow colloidal particles thereof, wherein the types have different particle sizes; and dispersing the at least two types of hollow colloidal particles to produce an amorphous structure, wherein the amorphous structure realizes the same color independently of an angle of an incident light thereto.

11 Claims, 5 Drawing Sheets

(51) Int. Cl.
*B01J 13/00* (2006.01)
*C09C 1/30* (2006.01)
*B01J 13/18* (2006.01)
*B01J 13/20* (2006.01)
B82Y 20/00 (2011.01)

(56) References Cited

OTHER PUBLICATIONS

Harun-Ur-Rashid, Mohammad et al., 'Angle-Independent Structural Color in Colloidal Amorphous Arrays', ChemPhysChem, 2010, vol. 11, pp. 579-583.
Deng, Tian-Song et al, 'Synthesis of Monodisperse Polystyrene@Vinyl-SiO2 Core-Shell Particles and Hollow SiO2 Spheres', Chem.Mater. 2012, vol. 24, pp. 536-542.
Magkiriadou, Sofia et al., 'Disordered Packings of core-shell particles with angle-independent structural colors', Optical Materials Express, 2012, vol. 2, No. 10, pp. 1343-1352.

* cited by examiner

ANGLE-INDEPENDENT COLLOIDAL PARTICLES-BASED STRUCTURE AND METHOD FOR PRODUCING THE SAME

CROSS-REFERENCE TO RELATED APPLICATION

This application claims the benefit of Korean patent application No. 10-2017-0015955 filed on Feb. 6, 2017, the entire content of which is incorporated herein by reference for all purposes as if fully set forth herein.

BACKGROUND

Field of the Present Disclosure

The present disclosure relates to an angle-independent colloidal particles-based structure. The present disclosure relates to an angle-independent color-rendering colloidal particles-based structure and its manufacturing method. Further, the present disclosure relates to a colloidal particles-based structure and film exhibiting the same color without changing the color depending on the angle, and a method of manufacturing the same.

Discussion of Related Art

Most of the natural or artificial colors are realized by dyes or pigments. That is, the atomic group contained in the organic compound that causes color development contains unsaturated bonds, such that π electrons therein absorb the energy and are excited to emit color. Further, there is also a photonic crystal such as an opal or a tail feather of a peacock that reflects light structurally and renders colors. When creating a crystal structure in which the refractive index is repeated in a period equal to the wavelength of light, a specific wavelength region corresponding to the period may be reflected without loss by the crystal structure.

Typically, there is a periodic dielectric array characterized by an electromagnetic forbidden band or a photonic bandgap, wherein the array is classified into one-dimensional, two-dimensional and three-dimensional photonic crystal based on its periodicity. However, since, in the case of the photonic crystal, the light is reflected by the uniformly arranged structure, different wavelengths are achieved depending on the incident angles. Therefore, there is a limit to practical application thereof to real life.

However, as a solution to this problem, a random structure, not a uniformly arranged structure, is fabricated to produce photonic glass, where the light is reflected by the average distance between the particles. Thus, an angle-independent structure may be realized.

The photonic glass structure does not depend on the angle, but scatters light by Rayleigh scattering and Mie scattering. However, the amorphous structure scattering light has no angle dependency, but has a disadvantage in that the intensity of scattered light is weak. As a typical example of this, Plum-throated Cotinga has a blue feather including keratin particles and pores and having an irregular arrangement of the pores. This feather may have an isotropic structure. In such a structure, scattered light beams are interfered with constructively, and the conditions under which such interference occurs may not depend on the directions. Therefore, a color is rendered in an independent manner on the viewing angle or the angle of the incident light.

The amorphous structure has a form factor and a structure factor by Rayleigh scattering and Mie scattering, which causes light scattering.

Colloidal particles have been studied to produce various particles. Furthermore, it has been studied to specify the structure of particles by controlling interactions such as attraction and repulsion between colloidal particles. The structure of these colloidal particles may be divided into a crystalline structure and an amorphous structure. Particularly, studies on the characteristics of amorphous regions and manufacturing various amorphous structures have been actively conducted.

In the case of the conventional crystalline structure using the colloidal particles, there is a problem that the structure having the crystalline particles using one same size is fabricated, which shows the dependency on the angle. A solution to this is needed.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

In order to solve the problem of angle dependence of the existing crystalline structure using colloidal particles, in accordance with the present disclosure, two or more kinds of colloidal particles of different sizes are prepared, and an amorphous structure is prepared using the colloidal particles, thereby providing an angle-independent colloidal particle structure.

In a first aspect of the present disclosure, there is provided a method for producing an angle-independent colloidal particles-based structure, the method comprising: preparing two or more types of hollow colloidal particles, wherein the types are distinguished based on a size of the hollow colloidal particles thereof, wherein the types have different particle sizes; and dispersing the at least two types of hollow colloidal particles to produce an amorphous structure, wherein the amorphous structure realizes the same color independently of an angle of an incident light thereto.

In one embodiment of the first aspect, preparing the two or more types of hollow colloidal particles includes preparing one type of a hollow colloidal particle, wherein preparing said one type of the hollow colloidal particle comprises: preparing a core particle; coating an inorganic shell on an outer face of the prepared core particle to form a core-shell particle; and heat-treating the core-shell particle to remove the core from the core-shell particle to hollow the particle.

In one embodiment of the first aspect, the core particle is made of a flammable organic material.

In one embodiment of the first aspect, the method further comprises incorporating at least one of carbon nanotube (CNT), carbon black or Fe particles into the amorphous structure.

In a second aspect of the present disclosure, there is provided a method for producing an angle-independent colloidal particles-based film, the method comprising: preparing two or more types of hollow colloidal particles, wherein the types are distinguished based on a size of the hollow colloidal particles thereof, wherein the types have different particle sizes; dispersing the at least two types of hollow colloidal particles to produce an amorphous structure; and filling gaps between the particles of the amorphous structure with a material having a refractive index similar to a refractive index of the particles, wherein the film realizes the same color independently of an angle of an incident light thereto.

In one embodiment of the second aspect, wherein preparing the two or more types of hollow colloidal particles includes preparing one type of a hollow colloidal particle, wherein preparing said one type of the hollow colloidal particle comprises: preparing a core particle; coating an inorganic shell on an outer face of the prepared core particle to form a core-shell particle; and heat-treating the core-shell particle to remove the core from the core-shell particle to hollow the particle.

In one embodiment of the second aspect, the core particle is made of a flammable organic material.

In one embodiment of the second aspect, the method further comprises incorporating at least one of carbon nanotube (CNT), carbon black or Fe particles into the amorphous structure.

In a third aspect of the present disclosure, there is provided an angle-independent colloidal particles-based structure, the structure containing two or more types of hollow colloidal particles, wherein the types are distinguished based on a size of the hollow colloidal particles thereof, wherein the types have different particle sizes, wherein the at least two types of hollow colloidal particles are dispersed in the structure to form an amorphous structure, wherein the amorphous structure realizes the same color independently of an angle of an incident light thereto.

In one embodiment of the third aspect, the amorphous structure has variations in color reflected from the structure based on a thickness of the shell of the hollow particles.

In one embodiment of the third aspect, whether the amorphous structure has reflection of ultraviolet light depends on an inner pore size of the hollow particle.

In one embodiment of the third aspect, the amorphous structure further includes at least one of carbon nanotubes (CNT), carbon black, and Fe particles, whereby light scattering due to impurities in the structure is suppressed.

In one embodiment of the third aspect, the colloidal particles-based structure is used as an ultraviolet screening agent.

In one embodiment of the third aspect, the colloidal particles-based structure is used in color cosmetics, paint for painting, and optical-fibers.

In a fourth aspect of the present disclosure, there is provided an angle-independent colloidal particles-based film, the film comprising: an amorphous structure containing two or more types of hollow colloidal particles, wherein the types are distinguished based on a size of the hollow colloidal particles thereof, wherein the types have different particle sizes, wherein the at least two types of hollow colloidal particles are dispersed in the structure to form the amorphous structure; and a filler filing gaps between colloidal particles of the amorphous structure, wherein the filler includes a material having a refractive index similar to the colloidal particle, wherein the film realizes the same color independently of an angle of an incident light thereto.

In one embodiment of the fourth aspect, the film has variations in color reflected from the film based on a thickness of the shell of the hollow particles.

In one embodiment of the fourth aspect, whether the film has reflection of ultraviolet light depends on an inner pore size of the hollow particle.

In one embodiment of the fourth aspect, the film further includes at least one of carbon nanotubes (CNT), carbon black, and Fe particles, whereby light scattering due to impurities in the structure is suppressed.

In one embodiment of the fourth aspect, the colloidal particles-based film is used as an ultraviolet screening agent.

In one embodiment of the fourth aspect, the colloidal particles-based film is used in color cosmetics, paint for painting, and optical-fibers.

According to the present disclosure, it is possible to provide angle-independent color-rendering colloidal particles-based structures.

In addition, it is possible to adjust the color of the scattered light by controlling the thicknesses of the shells of the colloidal particles.

In addition, it is possible to provide UV-blocking particles by controlling the pore sizes of the colloidal particles.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1:
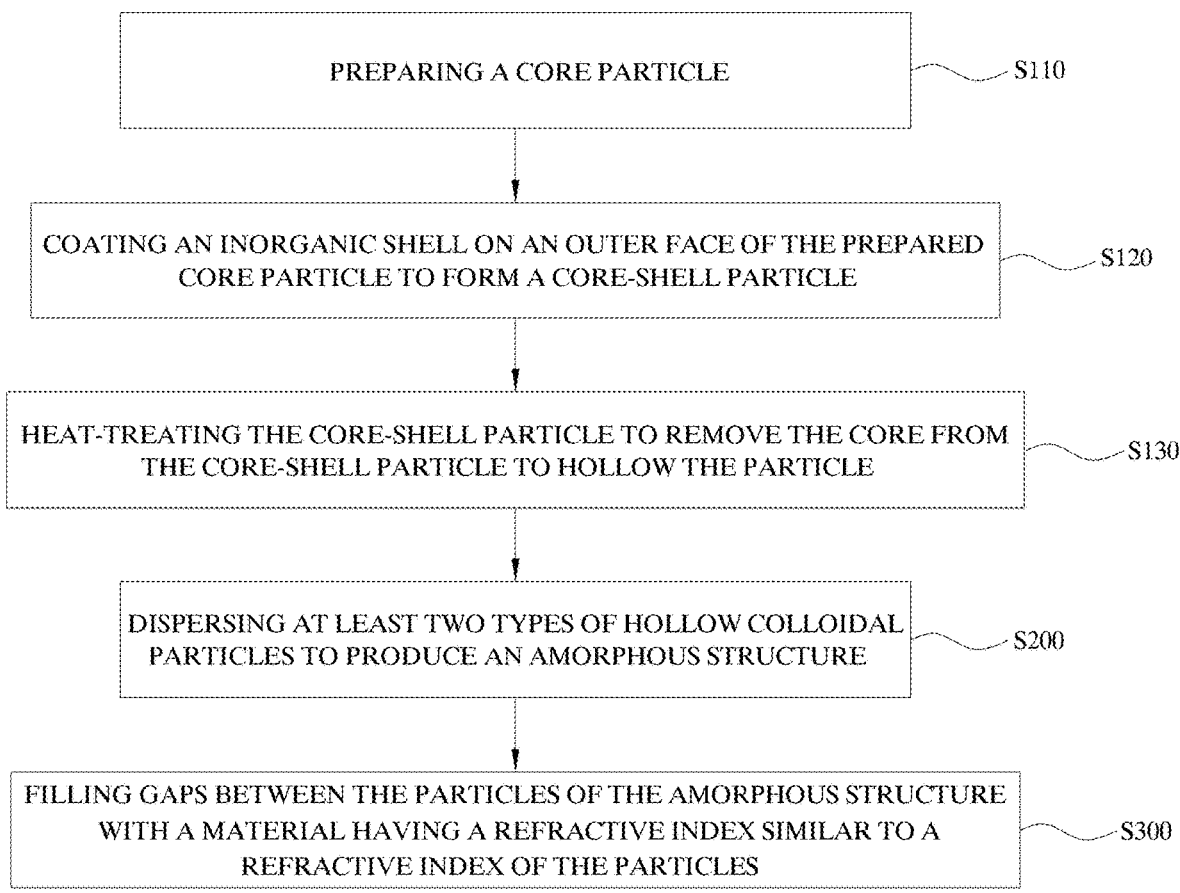
FIG. 1 shows a flow chart of a method for manufacturing angle-independent colloidal particles-based structures according to one embodiment of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, and components have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

In accordance with the present disclosure, in order to solve the problem of angle dependence of the existing crystalline structure using colloidal particles, two or more kinds of colloidal particles of different sizes are prepared, and an amorphous structure is prepared using the colloidal particles, thereby providing an angle-independent colloidal particle structure. In the following, the details of the present disclosure will be described with reference to the drawings.

Figure 2:
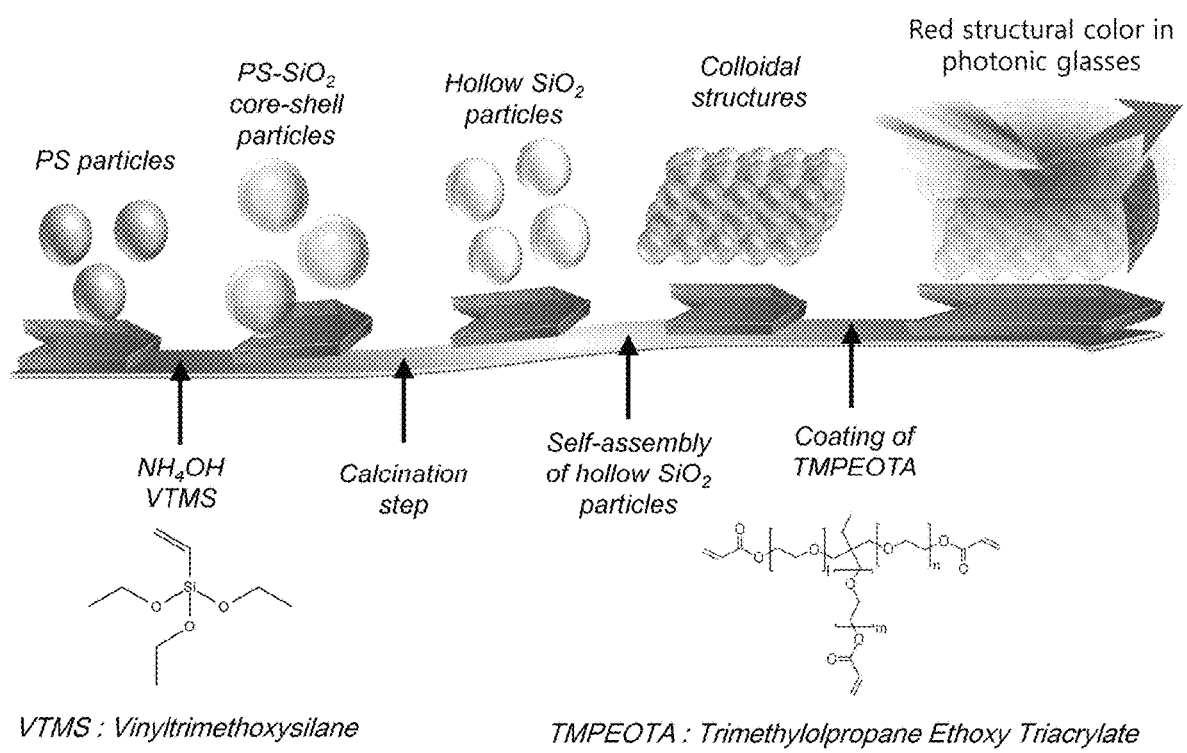
FIG. 2 shows a schematic diagram illustrating a method for manufacturing angle-independent colloidal particle-based structures according to one embodiment of the present disclosure.

FIG. 1 shows a flow chart of a method for manufacturing angle-independent colloidal particles-based structures according to one embodiment of the present disclosure. FIG. 2 shows a schematic diagram illustrating a method for manufacturing angle-independent colloidal particle-based structures according to one embodiment of the present disclosure.

A method of fabricating an angle-independent colloidal particles-based structure according to one embodiment of the present disclosure may include a step S 100 of preparing two or more kinds of hollow colloidal particles with different sizes and a step S 200 of dispersing the hollow colloidal particles to produce an amorphous structure amorphous structure.

At step S100, two or more kinds of hollow colloidal particles having different sizes are prepared. These hollow colloidal particles are fabricated by the following S 110 to S 130 steps.

Preparing the hollow colloidal particle comprises: preparing a core particle S 110; coating an inorganic shell on the outer face of the prepared core particle to prepare a core-shell particle S 120; and a step 130 of heat-treating the core-shell particle.

In step S 110, an organic material is used as the core particle, and it is preferable that the organic material is a combustible organic material. This is because in the subsequent heat treatment step S 130, the core material is burned away to form a hollow colloidal particle.

In step S 120, the core-shell particle is produced by coating a shell made of an inorganic material on the outer face of the core particle. As such an inorganic material, an inorganic material capable of forming a shell by a sol-gel process may be used. As such an inorganic material, any one of $SiO_2$, $TiO_2$, and $Al_2O_3$ is preferably used.

In step S 130, the core-shell particle is heat-treated. Through this heat treatment process, the hollow particle may be produced by burning the core material away.

In step S100, two or more kinds of hollow colloidal particles having different sizes are prepared. In step S 200, amorphous structure is prepared by dispersing the hollow colloidal particles. By fabricating the amorphous structure in this way, it is possible to fabricate the angle-independent colloidal particle-based structure independent of the angle of incidence of light.

Further, after step S 130, a step of mixing at least one of carbon nanotubes (CNT), carbon black, and Fe particles may be further included.

The carbon nanotubes (CNTs), carbon black, or Fe particles prevent scattering of light as may be otherwise generated by impurities. By removing the light scattering due to the impurity in this way, in the reflectance graph for the colloidal particles, the peak may be formed with a clear sharpness.

The method for manufacturing angle-independent colloidal particle-based structures has been described above. Hereinafter, a method of manufacturing a film including the angle-independent colloidal particles-based structure will be described. The description of the parts overlapping with those described above will be omitted, and the description will be focused on the features.

A method of producing a film including an angle-independent colloidal particles-based structure further includes, after the manufacturing of the angle-independent colloidal particles-based structure, the step S 300 in FIG. 1. A method of producing a film including an angle-independent colloidal particles-based structure may include preparing two or more kinds of hollow colloidal particles having different sizes from each other; the step S 200 of dispersing the hollow colloidal particles to prepare an amorphous structure; and filling gaps between the particles of the amorphous structure with a material having a refractive index similar to that of the particles S 300.

The hollow particles were prepared in the same manner as described above. The core particles may be formed of flammable organic material. The inorganic material may not be particularly limited as long as the material is made into a shell by the sol-gel process.

In step S 300, the gaps between the particles of the amorphous structure may be filled with a material having a refractive index similar to the particles. The material having a similar refractive index to the particles may be a polymer or an inorganic material. In this connection, the gaps may be filled through a reaction using a precursor. For example, in the case of using a $SiO_2$ shell, the filling may be performed through a reaction using silica precursor such as TEOS or TMOS. Alternatively, when using $TiO_2$ shell or $Al_2O_3$ shell, the gaps may be filled using the ALD method.

By filling the gaps between the particles of the amorphous structure with the material having a refractive index similar to that of the particle, an inverse structure may be formed to allow a form of a film. When the film is formed in this manner, the resulting structure is not collapsed.

The methods for producing the angle-independent colloidal particles-based structure, and the film containing the same have been described above. Hereinafter, the angle-independent colloidal particles-based structure and the film including the same will be described.

The angle-independent colloidal particles-based structure according to one embodiment of the present disclosure includes the amorphous structure comprising two or more types of hollow colloidal particles with different sizes. This amorphous structure is characterized by independence from the angle of the incident angle.

As for the angle-independent colloidal particle-based structure according to the present disclosure, by controlling the thickness of the shell of the hollow colloidal particle to adjust the structure factor thereof, the wavelength of the light reflected in the visible light region may be controlled, thereby changing the color rendered by the particles.

Further, as for the angle-independent colloidal particle-based structure according to the present disclosure, by controlling the inner pore size of the hollow particle to adjust the form factor, the reflection of ultraviolet rays may be controlled, thereby enabling the reflection of ultraviolet rays.

Further, as for the angle-independent colloidal particles-based structure according to the present disclosure, the amorphous structure may further include at least one of carbon nanotube (CNT), carbon black, and Fe particles. The scattering of light due to impurities may be suppressed by addition of such particles.

The angle-independent colloidal particles-based structure according to the present disclosure may be used as a UV blocking agent by using the ultraviolet reflection effect. Alternatively, the angle-independent colloidal particles-based structure according to the present disclosure may be used in color cosmetics, paints, and optical fibers because the color may be controlled by the angle-independent colloidal particles-based structure.

The film comprising the angle-independent colloidal particles-based structure according to one embodiment of the present disclosure may include the non-crystalline structure comprising two or more types of hollow colloidal particles having different sizes from one another. In order to form the film, the gaps between the colloidal particles of the amorphous structure may be filled with a material having a refractive index similar to that of the colloidal particles. Thus, the amorphous structure may be independent of the angles of the incident light.

As for the film including the angle-independent colloidal particle-based structure according to the present disclosure, by controlling the thickness of the shell of the hollow colloidal particle to adjust the structure factor thereof, the wavelength of the light reflected in the visible light region may be controlled, thereby changing the color rendered by the particles.

Further, as for the film including the angle-independent colloidal particle-based structure according to the present disclosure, by controlling the inner pore size of the hollow particle to adjust the form factor, the reflection of ultraviolet rays may be controlled, thereby enabling the reflection of ultraviolet rays.

Further, as for the film including the angle-independent colloidal particles-based structure according to the present disclosure, the amorphous structure may further include at least one of carbon nanotube (CNT), carbon black, and Fe particles. The scattering of light due to impurities may be suppressed by addition of such particles.

The film including the angle-independent colloidal particles-based structure according to the present disclosure may be used as a UV blocking agent by using the ultraviolet reflection effect thereof. Alternatively, the film including the angle-independent colloidal particles-based structure according to the present disclosure may be used in color cosmetics, paints, and optical fibers because the color may be controlled by the film including the angle-independent colloidal particles-based structure.

EXAMPLES

In the following, the details of the present disclosure will be further described with reference to the present specific example.

Present Example 1

In the present example of the present disclosure, an amorphous colloidal particles-based structure is fabricated using two types of hollow $SiO_2$ particles having two sizes respectively. Then, the resin and polymer having a refractive index similar to 1.45, which is the refractive index of silica, are used to fill the gaps existing between the particles of the colloidal particles-based structure. As a result, a film is produced that reflects light in the UV region corresponding to the form factor and reflects only light in the visible light region corresponding to the structure factor. The specific experimental procedure is carried out according to the schematic diagram as shown in FIG. 2.

The materials used in the present example are as follows: Styrene (>97%, Sigma-Aldrich), Potassium persulfate (KPS, Sigma-Aldrich), Sodium styrene sulfonate (NaSS, JUNSEI), Sodium hydrogen carbonate, $NaHCO_3$, JUNSEI), Inhibitor removers (Sigma Aldrich), Vinyltrimethoxy silane (VTMS, 98%, Sigma-Aldrich) and ammonium hydroxide solution ($NH_4OH$, 28?30%, Sigma-Aldrich), Trimethylolpropane ethoxy triacrylate (TMPEOTA, SK CYTEC), Darocur 1173 (SK CYTEC).

(a) Preparing Polystyrene Particle

To prepare a charged polymer particle, a solution of a negatively charged water-soluble polymer particle is prepared by emulsion polymerization. Specifically, in the state of maintaining the temperature of 450 g of water at 65 degree C., co-monomer (sodium styrene sulfonic acid, 0.5 g) for charge adjustment and pH adjusting salt (sodium bicarbonate, 0.5 g) are injected into the water to form a first mixture. Then, the mixture is stirred. Further, a monomer (styrene, 5.0 g) is injected into the first mixture to form a second mixture. Nitrogen is continuously fed into the second mixture for 30 minutes to lower the oxygen concentration therein. Thereafter, an initiator (potassium persulfate, 0.25 g) is injected into the second mixture. Thus, the reaction is carried out at a reaction temperature of 80° C. for 9 hours while maintaining the amount of the monomer and water evaporated by the condenser. As a result, a polymer (polystyrene) particle having a milky white color and negative charge and 200 nm or less particle size is obtained.

The polymer particles thus obtained are cleaned by centrifugation to remove impurities. In this regard, the centrifugation is carried out using distilled water at 12,000 rpm for 10 minutes, three times in total.

(b) Preparing Core-Shell Particles using the Polystyrene Particles and Silica Precursor PS-SiO$_2$ core-shell particles with uniform sizes are synthesized by sol-gel method. First, 1 ml of 1 wt % PS particles (in water) to be used as a core material was mixed with 10 ml of distilled water and 0.7 ml of ammonia. On the other hand, 2.0 ml of VTMS, which is a silica precursor, and 20 ml of distilled water are mixed with each other for 30 minutes to hydrolyze the precursor. Thereafter, the hydrolyzed precursor solution is mixed with the PS solution. Then, they react each other at a room temperature for 8 hours. Then, the solvent is removed using a membrane filter having a 200 nm pore size and an aspirator, and then the particles are cleaned using ethanol and then are dispersed in distilled water.

(c) Heat-Treating the Core-Shell Particle to Prepare Hollow Colloidal Particle

The prepared PS-SiO$_2$ colloidal particles are dried for 2 days using a freeze dryer and then heat-treated for 6 hours in an air atmosphere at 600° C. using a furnace.

(d) Producing Amorphous Structure Using the Hollow Particles

Two kinds of hollow colloidal particles having different sizes are dispersed in ethanol at 30 wt % to produce a first dispersion. CNT particles are dispersed in ethanol at a concentration of 0.1 wt % to produce a second dispersion. The first dispersion and the second dispersion are mixed at a ratio of 10:1 v/v to form a mixture. This mixture was dried in an oven at 40 degree C. to produce a closely packed structure.

Conventionally, an amorphous structure may be self-assembled into a non-close packed form by reducing the stability between particles using particles with the same size and salts. In such a self-assembled state, the solvent is evaporated to produce the random structure. However, in the case of this conventional approach, even when the particles having the same single size are used, the reflectance of the structure slightly differs each time the structure is manufactured.

Accordingly, the present inventors have attempted to fabricate a structure having a closely packed form but a random dispersion of the particles, unlike the conventional method. For this purpose, two types of hollow SiO$_2$ particles with different particle diameters are prepared. Then, the amorphous structures is prepared by mixing them.

When particles with the same size are mixed, the particles are arranged in a regular manner, thereby forming a photonic crystal structure with a long range order. To the contrary, when an amorphous structure is produced by mixing two types of particles having two different sizes, the particles are randomly arranged, whereby a photonic crystal structure having a short range order by this random arrangement may be realized. Further, when the average sizes of the particles produced by the close packing are substantially the same, the average distances between the particles are substantially the same, thereby achieving a constant reflectivity. Further, as described in step (e) below, the gap between the particles present in the fabricated structure is filled with TMPEOTA. This maintains the shape of the structure without changing the distance between the particles.

(e) Fabricating an Inverse Structure Using a Polymer Having the Same Refractive Index as the Hollow Particle A polymer and resin (TMPEOTA 100 ul) having a refractive index similar to that of the shell are dropped onto the colloidal particles-based structure prepared in step (d). This causes the polymer and resin to penetrate into the air gap in the structure. This allows the gap between the hollow colloidal particles to be filled by TMPEOTA, resulting in a film-like structure.

Figure 3:
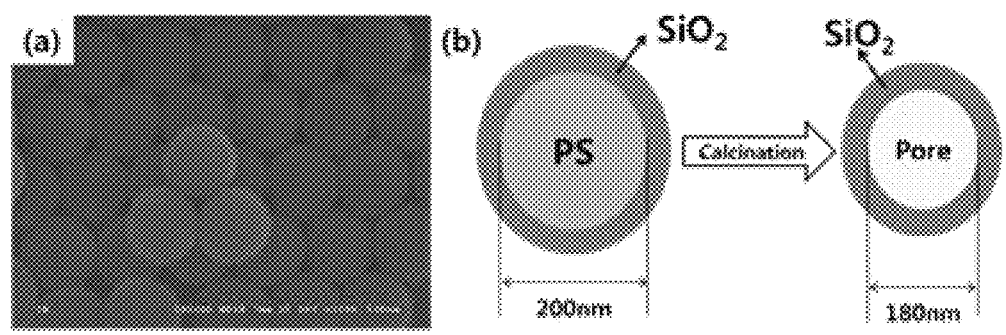
FIG. 3 is a SEM photograph of the particle prepared by the experimental example of the present disclosure.

FIG. 3 is a SEM photograph of the particle prepared by the experimental example of the present disclosure. FIG. 3(a) shows a PS particle of 200 nm, and FIG. 3(b) shows the change after the heat treatment thereof.

Figure 4:
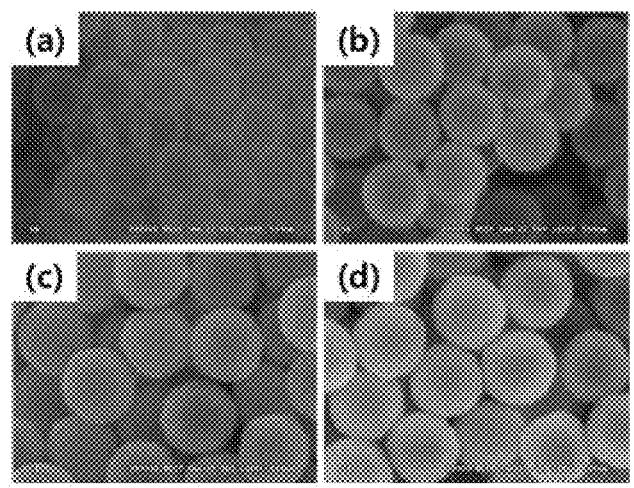
FIG. 4 are SEM images of hollow silica particles with 180 nm pore size as a core size and silica shell thicknesses of (a) 14 nm (b) 30 nm (c) and 38 nm (d) 44 nm, respectively.

FIG. 4 are SEM images of hollow silica particles with 180 nm pore size as a core size and silica shell thicknesses of (a) 14 nm (b) 30 nm (c) and 38 nm (d) 44 nm, respectively.

Figure 5:
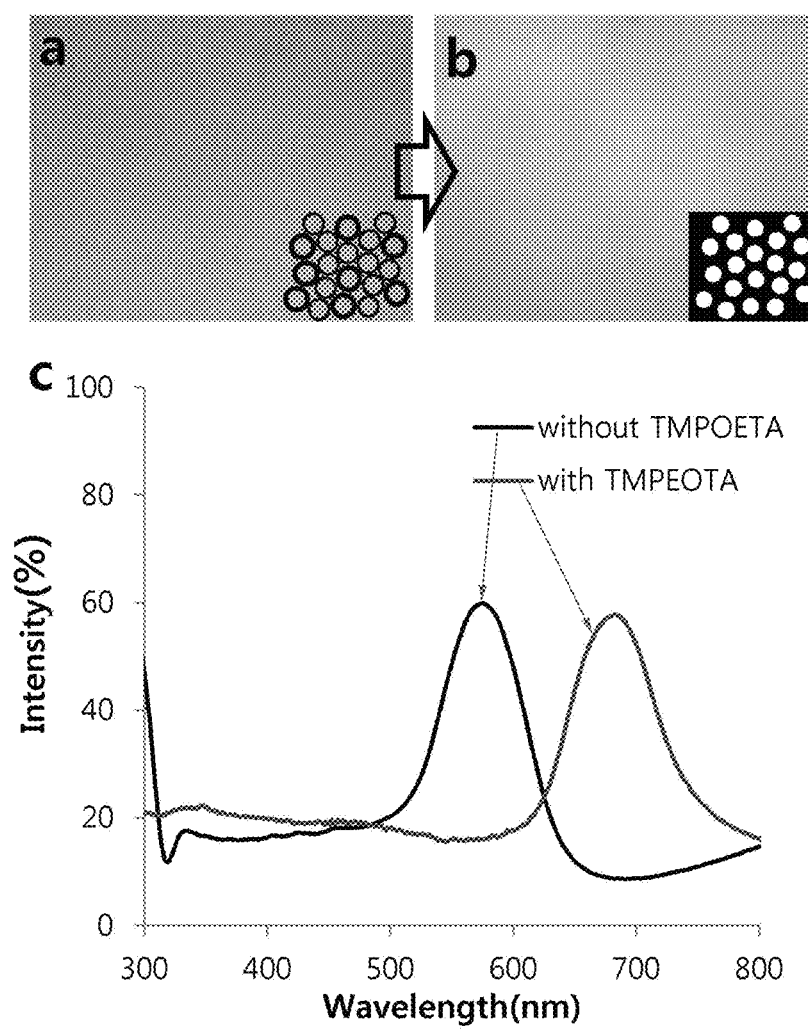
FIG. 5 shows an optical microscope photograph and a reflection graph of a colloidal particle-based structure using hollow particles of a specific size and a film produced by filling voids of the structure with TMPEOTA.

FIG. 5 shows an optical microscope photograph and a reflection graph of a colloidal particle-based structure using hollow particles of a specific size and a film produced by filling voids of the structure with TMPEOTA.

Referring to FIG. 5, when the pore size is 180 nm and the shell thickness is 30 nm and 44 nm respectively (corresponding to particle sizes 240 nm and 268 nm), the structure only including the particles exhibits cyan color as in FIG. 5(a), while the inverse structure shows a red color as shown in FIG. 5(b).

Based on the calculation results according to the calculation formula, the structure including only the particles has a scattering wavelength of 591 nm, and the inverse structure has a scattering wavelength of 687 nm. Further, when the actual reflectance was measured, reflectance values of about 579 nm and 682 nm were obtained, respectively, as shown FIG. 5(e).

As for the structure including only the particles, it is confirmed that a form factor having a value near 300 nm is measured as in the black graph of FIG. 5(e). Thus, it is confirmed that the effect of ultraviolet ray blocking by the structure is achieved.

While the foregoing description of the present disclosure has been provided with reference to preferred embodiments of the present disclosure, those skilled in the art will appreciate that various modifications and changes may be made to the present disclosure without departing from the spirit and scope of the present disclosure set forth in the claims that follow.

What is claimed is:

1. A method for producing a colloidal particle-based structure, the method comprising:
   preparing first and second hollow colloidal particles, wherein the first hollow colloidal particles are of a different particle size from the second hollow colloidal particles;
   dispersing the prepared first and second hollow colloidal particles to produce an amorphous structure, wherein the amorphous structure has a same structural color independent of an angle of an incident light thereto; and
   treating the amorphous structure with a polymer or an inorganic material to fill gaps between the first and second particles.

2. The method of claim 1, wherein preparing of the first hollow colloidal particles comprises:
   preparing a core particle;
   coating an inorganic shell on an outer face of the prepared core particle to form a core-shell particle; and
   heat-treating the core-shell particle to remove the core from the core-shell particle to hollow the particle.

3. The method of claim 2, wherein the core particle is made of a flammable organic material.

4. The method of claim 1, further comprising incorporating any one or any combination of any two or more of carbon nanotubes (CNT), carbon black, and Fe particles into the amorphous structure.

5. The method of claim 1, wherein preparing of the second hollow colloidal particles comprises:
    preparing a core particle;
    coating an inorganic shell on an outer face of the prepared core particle to form a core-shell particle; and
    heat-treating the core-shell particle to remove the core from the core-shell particle to hollow the particle.

6. The method of claim 5, wherein the core particle is made of a flammable organic material.

7. The method of claim 1, further comprising incorporating the treated amorphous structure into a cosmetic, a paint, or an optical fiber.

8. The method of claim 1, wherein the treated amorphous structure is a film that reflects ultraviolet light and reflects light in a portion of visible light spectrum.

9. The method of claim 1, wherein the structural color is of a wavelength equal to a period of a repeated refractive index in the structure.

10. A method for producing a colloidal particle-based structure, the method comprising:
    preparing first and second hollow colloidal particles, wherein the first hollow colloidal particles are of a different particle size from the second hollow colloidal particles;
    dispersing the prepared first and second hollow colloidal particles to produce an amorphous structure, wherein the amorphous structure has a same structural color independent of an angle of an incident light thereto, and
    treating the amorphous structure with a material having a refractive index the same as a refractive index of the first and second particles to fill gaps between the first and second particles.

11. The method of claim 10, further comprising incorporating any one or any combination of any two or more of carbon nanotubes (CNT), carbon black, and Fe particles into the amorphous structure.

* * * * *